(12) United States Patent
Kress

(10) Patent No.: US 7,430,061 B2
(45) Date of Patent: Sep. 30, 2008

(54) SYSTEM AND METHOD TO ELIMINATE CLIPPING DURING COLOR CONVERSION

(75) Inventor: William C. Kress, Mission Viejo, CA (US)

(73) Assignees: Toshiba Corporation (JP); Toshiba Tec Kabushiki Kaisha (JP)

( * ) Notice: Subject to any disclaimer, the term of this patent is extended or adjusted under 35 U.S.C. 154(b) by 616 days.

(21) Appl. No.: 11/030,686

(22) Filed: Jan. 6, 2005

(65) Prior Publication Data

US 2006/0146348 A1 Jul. 6, 2006

(51) Int. Cl.
*G03F 3/00* (2006.01)
*G06F 15/00* (2006.01)

(52) U.S. Cl. .................. 358/1.9; 358/517; 358/518; 358/520; 358/3.26; 382/167

(58) Field of Classification Search .................. 358/1.9, 358/1.2, 527, 518, 519, 520, 517, 3.23, 3.26; 348/232, 222, 223; 382/167, 166, 162; 345/581, 345/589, 590

See application file for complete search history.

(56) References Cited

U.S. PATENT DOCUMENTS

| | | | |
|---|---|---|---|
| 5,081,529 A | 1/1992 | Collette | |
| 5,243,414 A * | 9/1993 | Dalrymple et al. | 358/500 |
| 5,333,069 A * | 7/1994 | Spence | 358/517 |
| 5,335,097 A * | 8/1994 | Murakami | 358/520 |
| 5,539,540 A * | 7/1996 | Spaulding et al. | 358/518 |
| 5,553,199 A | 9/1996 | Spaulding et al. | |
| 5,583,666 A | 12/1996 | Ellson et al. | |
| 5,726,682 A | 3/1998 | Lum et al. | |
| 5,874,988 A | 2/1999 | Gu | |
| 5,920,322 A | 7/1999 | Ulichney | |
| 5,991,511 A | 11/1999 | Granger | |
| 6,225,974 B1 | 5/2001 | Marsden et al. | |
| 6,269,184 B1 * | 7/2001 | Spaulding et al. | 382/167 |
| 6,340,975 B2 | 1/2002 | Marsden et al. | |
| 6,487,308 B1 | 11/2002 | Ulichney et al. | |
| 6,571,011 B1 | 5/2003 | Andresen et al. | |

(Continued)

FOREIGN PATENT DOCUMENTS

| | | |
|---|---|---|
| EP | 720352 A1 * | 7/1996 |
| EP | 989739 A2 * | 3/2000 |
| EP | 1396996 A2 * | 3/2004 |

OTHER PUBLICATIONS

Eguchi, et al.; "The color correction of printer for computer graphics" IEEE Transactions on Consumer Electronics. Aug. 1988, vol. 34, No. 3, p. 523-529.*

(Continued)

*Primary Examiner*—Kimberly A Williams
(74) *Attorney, Agent, or Firm*—Tucker Ellis & West LLP

(57) ABSTRACT

A color enhancement system with variable color saturation addresses issues of clipping of an output image by analysis and application of color correction to individual pixels. Encoded image data is received, and the elements are converted from a color space representation, such as RGB, into another color space where the individual picture elements are color corrected. The color correction is accomplished by application of a correction matrix. Once correction has been applied, the values are converted back to the original color space representation.

30 Claims, 3 Drawing Sheets

U.S. PATENT DOCUMENTS

| | | |
|---|---|---|
| 6,611,356 B1 | 8/2003 | Shimizu et al. |
| 6,677,959 B1 | 1/2004 | James |
| 6,681,042 B1 | 1/2004 | Weldy |
| 6,711,289 B1 * | 3/2004 | Sakamoto .................... 382/167 |
| 6,868,179 B2 * | 3/2005 | Gruzdev et al. ............. 382/167 |
| 7,251,361 B2 * | 7/2007 | Gruzdev et al. ............. 382/167 |
| 2002/0030833 A1 * | 3/2002 | Kuwata et al. ................ 358/1.9 |
| 2002/0109856 A1 * | 8/2002 | Sasanuma et al. ............ 358/1.9 |
| 2003/0012433 A1 | 1/2003 | Gruzdev et al. |
| 2003/0052895 A1 * | 3/2003 | Akiyama et al. ............ 345/589 |
| 2003/0081831 A1 | 5/2003 | Fukao et al. |
| 2003/0117654 A1 * | 6/2003 | Wredenhagen et al. .... 358/3.21 |
| 2004/0001209 A1 * | 1/2004 | Chu et al. .................... 358/1.9 |
| 2004/0013298 A1 * | 1/2004 | Choe et al. ................. 382/167 |

OTHER PUBLICATIONS

Montag et al.; "Psychophysical evaluation of gamut mapping techniques using simple rendered images and artificial gamut boundaries" IEEE Transactions on Image Processing. Jul. 1997, vol. 6, No. 7, p. 977-989.*

Watanabe et al.; "Improvement of color quality with modified linear multi-scale retinex" Proceedings of the SPIE. 2003, vol. 5008, p. 59-69.*

* cited by examiner

US 7,430,061 B2

SYSTEM AND METHOD TO ELIMINATE CLIPPING DURING COLOR CONVERSION

BACKGROUND OF THE INVENTION

The subject invention is directed to a system and method for printing of color images. Transforming RGB values into CMYK values suitable for a color laser printer is often done using a 3-dimensional look-up table (LUT). However, this requires significant processing of the data for the interpolation. The system presented herein teaches a color rendering scheme which is particularly advantageous in reducing color conversion processing demands in a displayed or printed image.

In printers, such as in color ink jet and color laser printers, conversions of RGB values to printer colorant values requires considerations of the attributes of the printer's colorants, such as unwanted absorptions, absence of perfect additivity and proportionality, and the like. One way of providing the color conversion from input RGB to output CMYK values is to use simple matrix multiplication. In the past, this was accomplished with a common practice of applying a masking equation that adjusts an image for better reproduction. Such masking equations are typically are a set of linear formulas, the strength of which determines the degree of color correction. In a typical system, a mask is either preset for a printer or fixed for an image for uniform application to each pixel forming that image.

While such image corrections are advantageous for attributes, such as enabling very fast color conversions which compensate for the unwanted absorptions of colorants or additivity and proportionality of color, as noted above, such schemes are prone to clipping of colors which have higher degrees of color saturation. The resultant transformation to the printer or output device color output results in a loss in an ability to accurately reproduce these high colors and the visible result will be undesirable hue shifts and clipping of colors.

It would be desirable to have a color correction system which functions to eliminate or minimize clipping of color values at or near the saturation level while simultaneously maintaining image quality and contrast. The subject invention solves these problems, and others, and provides a system and method for applying a variable saturation scheme that is readily and inexpensively provided with color printing systems.

SUMMARY OF THE INVENTION

In accordance with the subject invention, there is provided a system for receiving image data which is encoded in an n-dimensional color space. For example, a suitable color space is RGB (Red, Green and Blue) color space. Received image data is optionally scaled to a selected range and then converted to be represented in another space, such as density. At this point, the amount of saturation is computed for each pixel and the correction values applied of which are weighed in accordance with the saturation characteristics of each individual picture element e.g., ("pixel" or "pel"). Once corrected, this data is then converted back to the n-dimensional color space and provided as an output to an image rendering device.

In accordance with a more limited aspect of the subject invention, the conversion between the color space and the space in which the transform is performed is accomplished by a function of a selected gamma value.

In accordance with another aspect of the subject invention, the image values are converted to density space prior to correction thereof. In this situation, once corrected, the values are converted from density space to an output space suitable for printing.

In accordance with another aspect of the subject invention, the image values are matrixed directly without conversion to reflection or density.

These and other aspects, advantages, and features will be understood by one of ordinary skill in the invention upon reading and understanding the specification.

BRIEF DESCRIPTION OF THE DRAWINGS

The subject invention does describe with reference to certain parts, arrangements of parts and logic flow diagrams which are evidenced in conjunction with the associated drawings which form a part hereof and are not for purposes of limiting the same, in which.

DETAILED DESCRIPTION OF THE PREFERRED EMBODIMENT AND ALTERNATIVE EMBODIMENTS

Figure 1:
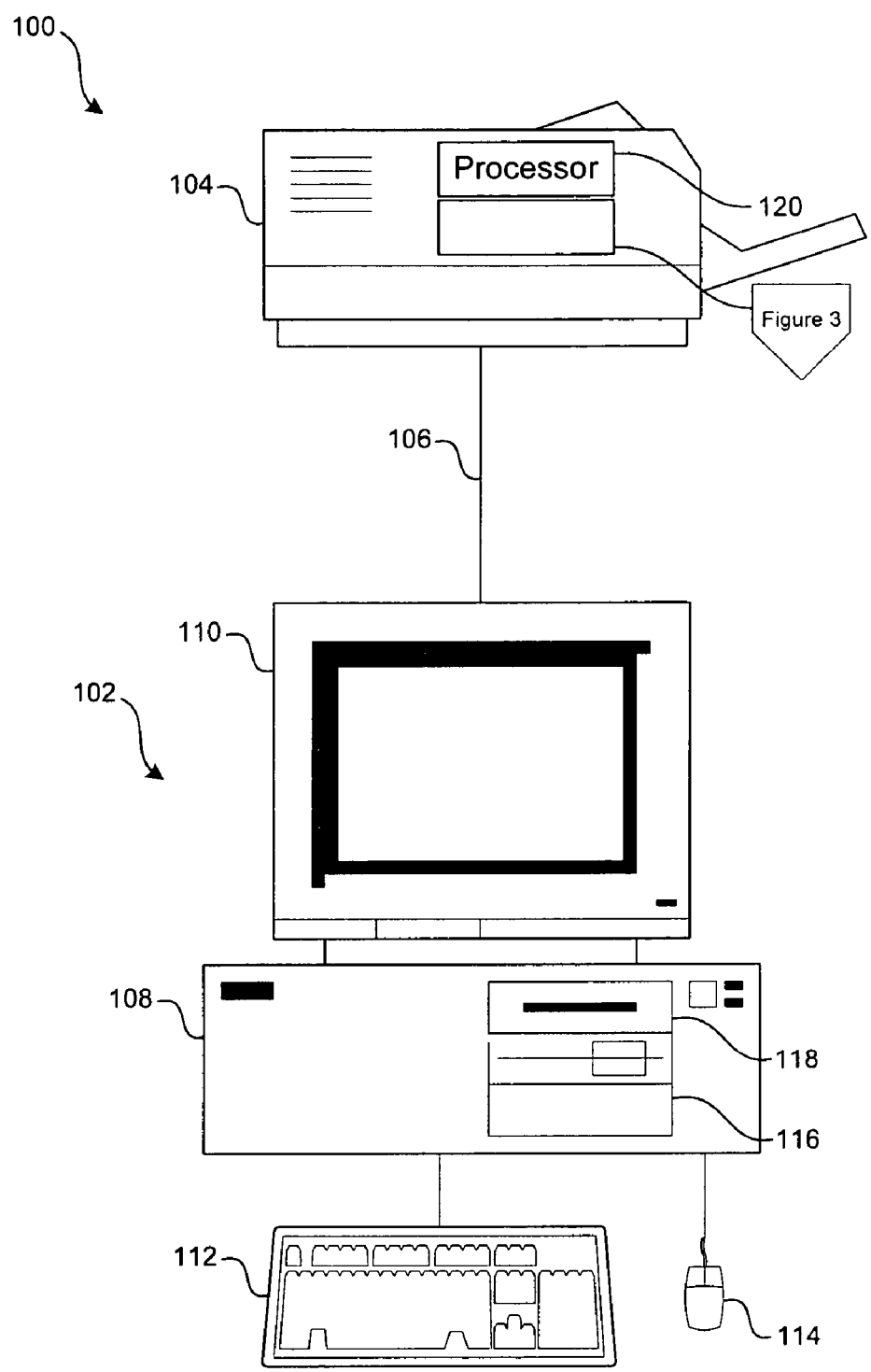
FIG. 1 is a block diagram illustrative of a suitable environment for use in conjunction with the subject invention.

Turning now to the drawings wherein the illustrations are for illustrating the preferred and alternative embodiments of the invention, and not for the purpose of limiting the same, FIG. 1 depicts a graphics processing system 100 that includes a data processing device, such as a workstation or computer terminal 102, which is in data communication to a data output device 104 via a data interface 106. The system 102 is conventional and includes conventional intelligence and input/output as illustrated by base unit 108, visual display 110, keyboard 112, mouse 114, non-volatile storage 116 and removable storage 118. The unit 102 is suitably any conventional data processing device operating on any conventional platform, such as Windows, MacOS, Unix, Linux, or the like. Data interface 106 is any suitable data carrying transport mechanism, such as Ethernet, Wireless Protocol, such as 802.11x, Infrared (IR), Bluetooth, WiMax, TCP/IP or the like.

Figure 3:
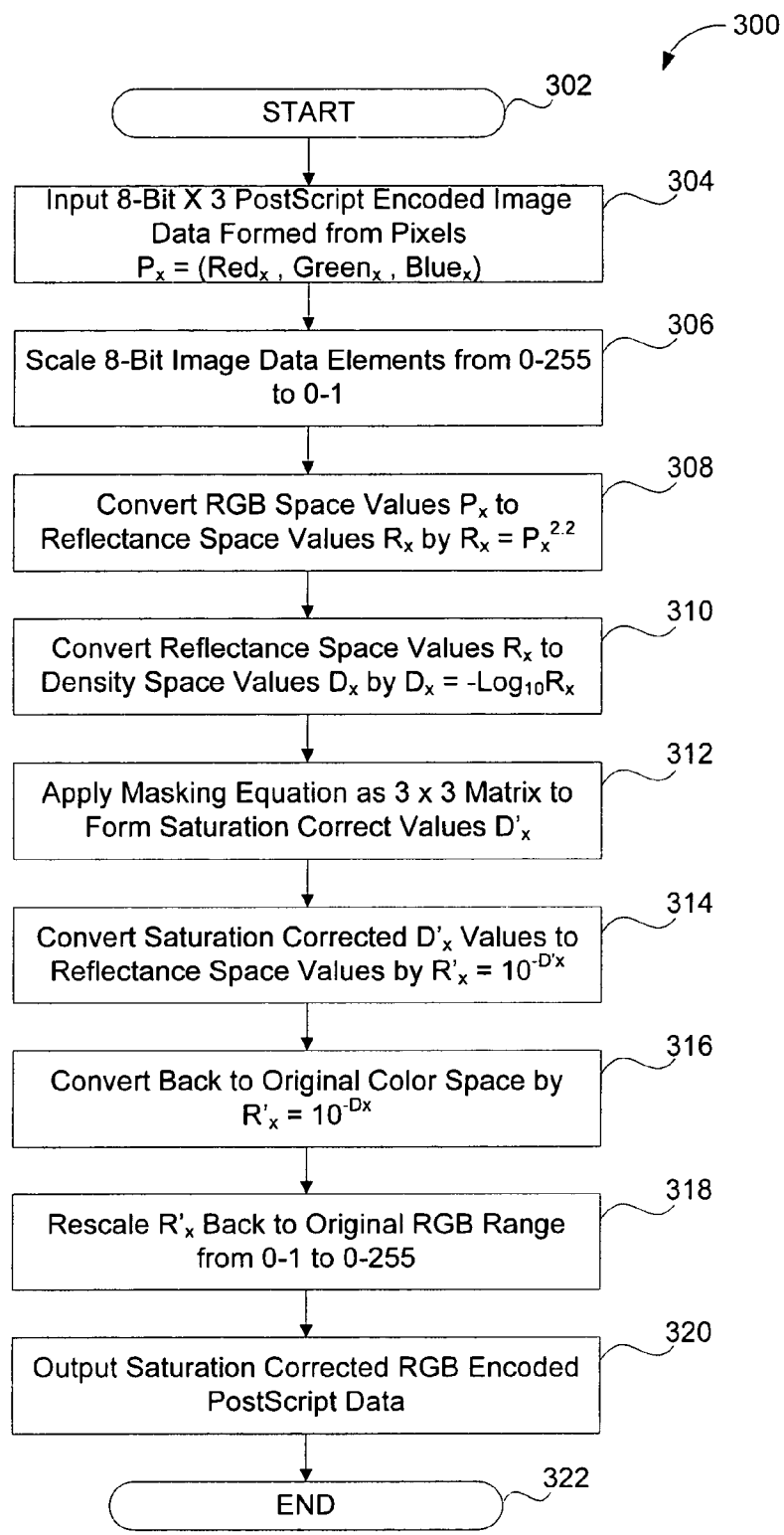
FIG. 3 is a flow chart of a particular application of the subject saturation correction in use in a preferred embodiment.

In the illustrated processing system 100, a data output device, such as printer 104, includes its own intelligence as illustrated by processor 120, and an ability to operate an intelligent algorithm, such as illustrated by FIG. 3, therefrom. It will be appreciated by one of ordinary skill in the art that the subject system is also suitably operatable by intelligence provided in the workstation 102, or alternatively in a printer controller (not shown). Further, it will be appreciated that the subject saturation correction scheme is also suitably applied to image generator, such as on display 110.

Figure 2:
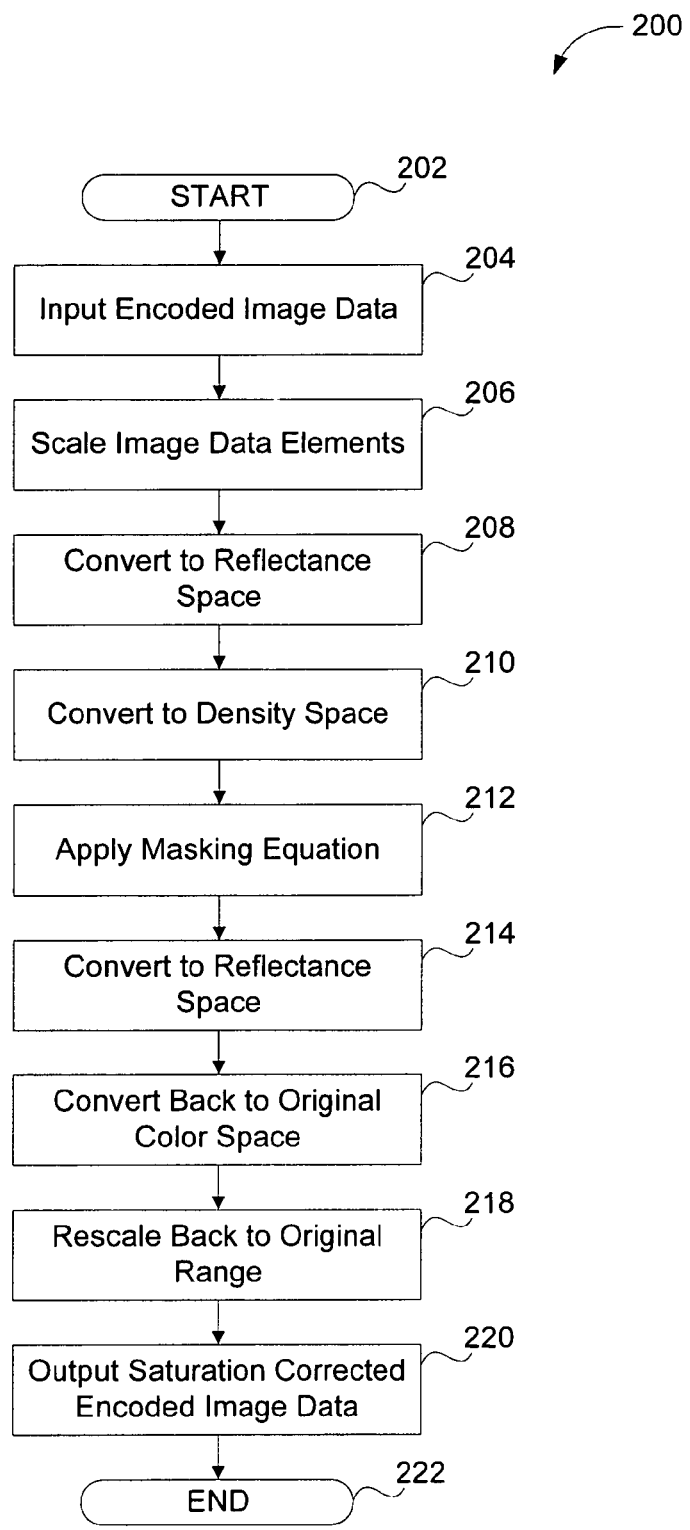
FIG. 2 is a flow chart illustrating an alternative system for saturation correction which uses a conversion to a density space.

Turning now to FIG. 2, a flow diagram is provided which also includes a further conversion from reflectance space to density space for enhanced saturation correction as noted above. The enhanced correction operation 200 commences at block 202. Image data is input at block 204. In the embodiment illustrated in FIG. 2, an additional calculation is suitably made in block 206. In this embodiment, the image values $C_x$ are advantageously scaled to a range of 0 to 1. By way of example, in an 8-bit system, a proportional value between 0 to 1 would be given for color values between 0 and 255.

Next, in block 208, a conversion of the scale data elements is a conversion to density space D from both reflectance space is completed at density space D at block 210. It is to be appreciated that the scaling step 206 is not solely for use in conjunction with a density space conversion. Such scaling is also suitably used with a reflective space correction as illustrated in conjunction with FIG. 2.

A suitable conversion from reflectance space block value $R_x$ to corresponding density space value $D_x$ is provided by $D_x$ values as $-Log_{10}R_x$. It will be appreciated that each value in the density space $D_x$ is therefore corresponding to a value $P_x$ in the original encoding space.

This saturation correction is suitably accomplished by application of a masking equation, such as with application of a 3×3 matrix, as will be appreciated by one of ordinary skill in the art. Such matrix is suitably applied to values in density space. However, as will be detailed below, it is advantageous to provide further space conversion in certain situation for enhancement to the saturation correction. Such additional conversion will be detailed below.

A suitable masking equation is realized in connection with an application of a matrix in the form:

$$\begin{bmatrix} 1-k(a_{12}+a_{13}) & ka_{12} & ka_{13} \\ ka_{21} & 1-k(a_{21}+a_{23}) & ka_{23} \\ ka_{31} & ka_{32} & 1-k(a_{31}+a_{32}) \end{bmatrix}.$$

As used herein, a $a_{ij}$ are the masking equation off diagonal components. The value k is a saturation factor which is suitably set during calibration/characterization.

In the subject embodiment, the coefficients $a_{ij}$ of the conversion matrix are fixed for an entire image. However, the value k is altered to adjust for saturation of each individual picture element. Application of the masking equation, frequently referred to as a 3×3 matrix, is thereby provided uniquely to each pixel, depending on its saturation characteristics. It will be appreciated therefore that the value k is to be computed to accomplish adjustment for a particular pixel.

In a general case, a suitable determination for a saturation value may be realized by the following equation:

$M_x = max(abs(R-G), abs(R-B), abs(G-B))$

The value of k in the color correction matrix is a function of $M_x$ and depends on the degree of saturation. Although it can be a simple function, such as $k=1-M_x$ typically is a more complex function and can be defined by a one-dimensional LUT.

It will be appreciated that the subject conversion system is therefore fixed, and is applied to every pixel of an image in the preferred embodiment. The system functions to change a strength of the matrix from lower to higher (color boost) as may be warranted. Thus, an adjustment factor is dynamically altered for each pixel of the image.

Next, a masking equation is completed at block 212. A corrected image set is communicated $D'_x$ is thereby communicated to block 214 which accomplishes a reversal to revert the elements to be in reflectance space. This is suitably accomplished by the conversion and wherein $R'_x$ as $10^{-D'x}$.

Next, in block 216, the reflectance space values $R_x$ are converted to their original color space values by application of $P'_x$ as $R'^{1/G}_x$.

Next, in block 218, the 0-1 value resultant from the correction is returned to the original image value to undo the scaling that was accomplished at block 206. Next, in block 220 the saturation corrected image data is output in block 220, and the process is completed at block 222.

Turning next to FIG. 3, a system 300 for conversion to a corrected saturation value will be described in a preferred embodiment which includes an input of PostScript data encoded in RGB format. In this embodiment, the process is commenced at block 302 and progresses to block 304. Herein, a 8-bit×3 postscript encoded image in RGB format is provided in the form $P_x = Red_x Green_x Blue_x$.

In the illustrated embodiment, each value $Red_x Green_x Blue_x$ is 0 to 255. Next, in block 306, this 0 to 255 value is scaled to a value of 0 to 1.

Next, in block 308, the scaled RGB value of $P_x$ is converted to reflectance space by $R_x = P_x^{2.2}$, wherein 2.2 is a gamma value particularly advantageous in the subject conversion.

Next, at block 310, the reflectance face value $R_x$ are converted to density space $D_x$ by application of the formula $D_x = -Log_{10}R_x$. Next the saturation and K values were calculated as described for FIG. 2.

Next, at block 312, a masking equation of a 3×3 matrix is applied to have corrected values $D'_x$. As noted above, conversion of the corrected value $D'_x$ back to reflectance space is accomplished by application of the formula $R'_x = 10^{-D'x}$ as illustrated at block 314.

Next, at block 316, the data is converted back to the original RGB space by application of the equation $P'_x = R'^{1/G}_x$, wherein G=2.2 in the preferred embodiment. Rescaling to the original 0-255, 8-ranges then accomplished in block 318. Finally, an output of the saturation corrected RGB encoded postscript data is accomplished at block 320 and the process is completed at block 322. Thus, the subject system advantageously teaches an effective mechanism by which saturation is suitably accomplished for each pixel element, and such conversion is not uniformly applied to each pixel. Thus, enhanced saturation correction is available.

It will be understood that various changes, substitutions, and alterations are suitably made to the subject disclosure without departing from the spirit and scope of the invention as defined by the appended claims. It will be appreciated that various changes and in details, materials, and arrangements of parts, which have been described herein and illustrated in order to explain the nature of the invention, are suitably made by those of skill in the art within the principle and scope of the invention and is incorporated into the appended claims.

What is claimed:

1. A system for dynamic color saturation adjustment comprising:

means adapted for receiving an image data set formed from pixel values P encoded in an n-dimensional color space C, wherein n is an integer greater than one, such that each pixel $P_x$ of the image data is represented by a value $P_x = (C_{1x}, C_{2x}, \ldots, C_{nx})$, wherein each received image pixels $P_x$, is in a selected value range;

reflectance space conversion means adapted for converting received image data $P_x$, to input reflectance space data comprised of corresponding values in reflectance space;

density space conversion means, including means adapted for logarithmically converting input reflectance space data so as to be represented by corresponding values $R_x$ in a density space;

saturation correction means adapted for generating saturation corrected values $R'_x$ by application of a masking equation corresponding to each value $R_x$;

the density space conversion means further including antilog conversion means adapted for converting the saturation corrected values $R'_x$ from the density space to output reflectance space data comprised of corresponding values thereto:

means adapted for converting output reflectance space data to the n-dimensional color space C as corresponding saturation corrected pixel values $P'_x$; and means adapted for outputting the saturation corrected pixel values $P'_x$ as a saturation corrected image data set output.

2. The system for dynamic color saturation adjustment of claim 1 wherein the density space conversion means includes:

means adapted for generating the values $R_{x\,as\,Px}^{G}$, wherein G is a selected gamma correction factor corresponding to an associated display; and means adapted for generating values $P'_x$ as $R'^{1/G}_x$.

3. The system for dynamic color saturation adjustment of claim 2 wherein the saturation correction means includes:

density space conversion means including means adapted for converting density space $R_x$ values so as to be represented by corresponding values $D_x$ in a density space;

masking means adapted for applying a masking operation to values $D_x$ so as to form corresponding saturation corrected density values $D'_x$; and the density space conversion means includes means adapted for converting the saturation corrected density values $D'_x$ from the density space to the density space as to generate the saturation corrected values $R'_x$.

4. The system for dynamic color saturation adjustment of claim 3 wherein the density space conversion means includes:

means adapted for generating the $D_x$ values as $-Log_{10}R_x$; and means adapted for generating the $R'_x$ as $10^{-D'x}$.

5. The system for dynamic color saturation adjustment of claim 4, wherein the color space C is RGB, such that $C_1$=Red, $C_2$=Green, and $C_3$=Blue, wherein each value $C_n$ is has a binary value in the range of 0 to $2^M$, wherein $M \geq 8$.

6. The system for dynamic color saturation adjustment of claim 5 wherein M=8 and wherein G=2.2.

7. The system for dynamic color saturation adjustment of claim 2 further comprising:

means adapted for calculating for each pixel $P_x$ a corresponding saturation adjustment value specific thereto as a function of $C_{1x}, C_{2x}, \ldots, C_{nx}$; and means adapted for applying the corresponding saturation adjustment value to each pixel so as to generate each corresponding $R'_x$.

8. The system for dynamic color saturation adjustment of claim 7 wherein the color space C is RGB, such that $C_1$=Red, $C_2$=Green, and $C_3$=Blue, and wherein each saturation adjustment value is formed as function of:

$$M_x = max(abs(R-G), abs(R-B), abs(G-B)).$$

9. The system for dynamic color saturation adjustment of claim 8 wherein L is the selected value range, and wherein $0 \leq L \leq U$, wherein U is a pre-selected upper limit defining the selected value range, and wherein each saturation adjustment value is further defined as a function of a weighting value $W_x$ such that:

$$W_x = f(U - M_x).$$

10. A method of dynamic color saturation adjustment comprising the steps of:

receiving an image data set formed from pixel values P encoded in an n-dimensional color space C, wherein n is an integer greater than one, such that each pixel $P_x$ of the image data is represented by a value $P_x = (C_1, C_2, \ldots, C_n)$ wherein each received image pixels $P_x$ is in a selected value range;

converting received image data $P_x$ to input reflectance space data comprised of corresponding values in reflectance space;

logarithmically converting input reflectance space data so as to be represented by corresponding values $R_x$ in a density space;

generating saturation corrected values $R'_x$ by application of a masking equation corresponding to each value $R_x$;

performing an antilog conversion of the saturation corrected values $R'_x$ from the density space to output reflectance space data comprised of corresponding values thereto;

converting output reflectance space data to the n-dimensional color space C as corresponding saturation corrected pixel values $P'_x$; and outputting the saturation corrected pixel values $P'_x$ as a saturation corrected image data set output.

11. The method of dynamic color saturation adjustment of claim 10 further comprising the steps of:

generating the values $R_x$ as $P_x^G$, wherein G is a selected gamma correction factor corresponding to an associated display; and generating values $P'_x$ as $R'^{1/G}_x$.

12. The method of dynamic color saturation adjustment of claim 11 further comprising the steps of:

converting density space $R_x$ values so as to be represented by corresponding values $D_x$ in a density space;

a masking operation to values $D_x$ so as to form corresponding saturation corrected density values $D'_x$; and converting the saturation corrected density values $D'_x$ from the density space to the density space as to generate the saturation corrected values $R'_x$.

13. The method of dynamic color saturation adjustment of claim 12 further comprising the steps of:

generating the $D_x$ values as $-Log_{10}R_x$; and generating the $R'_x$ as $10^{-D'x}$.

14. The method of dynamic color saturation adjustment of claim 13, wherein the color space C is RGB, such that $C_1$=Red, $C_2$=Green, and $C_3$=Blue, wherein each value $C_n$ is has a binary value in the range of 0 to $2^M$, wherein $M \geq 8$.

15. The method of dynamic color saturation adjustment of claim 14 wherein M=8 and wherein G=2.2.

16. The method of dynamic color saturation adjustment of claim 11 further comprising the steps of:

calculating for each pixel $P_x$ a corresponding saturation adjustment value specific thereto as a function of $C_1, C_2, \ldots, C_n$; and applying the corresponding saturation adjustment value to each pixel so as to generate each corresponding $R'_x$.

17. The method of dynamic color saturation adjustment of claim 16 wherein the color space C is RGB, such that $C_1$=Red, $C_2$=Green, and $C_3$=Blue, and wherein each saturation adjustment value is formed as function of:

$$M_x = max(abs(R-G), abs(R-B), abs(G-B)).$$

18. The method of dynamic color saturation adjustment of claim 17 wherein L is the selected value range, and wherein $0 \leq L \leq U$, wherein U is a pre-selected upper limit defining the selected value range, and wherein each saturation adjustment value is further defined as a function of a weighting value $W_x$ such that:

$$W_x = f(U - M_x).$$

19. A computer-readable medium of instructions with computer-readable instructions stored thereon for dynamic color saturation adjustment comprising:

instructions for receiving an image data set formed from pixel values P encoded in an n-dimensional color space C, wherein n is an integer greater than one, such that each pixel $P_x$ of the image data is represented by a value $P_x=(C_1, C_2, \ldots, C_n)$ wherein each received image pixels $P_x$, is in a selected value range; instructions for converting received image data $P_x$ to input reflectance space data comprised of corresponding values in reflectance space;

instructions for logarithmically converting input reflectance space data so as to be represented by corresponding values $R_x$ in a density space;

instructions for generating saturation corrected values $R'x$ by application of a masking equation corresponding to each value $R_x$;

instructions for performing an antilog conversion the saturation corrected values $R'_x$ from the density space to output reflectance space data comprised of corresponding values thereto;

converting output reflectance space data to the n-dimensional color space C as corresponding saturation corrected pixel values $P'_x$; and instructions for outputting the saturation corrected pixel values $P'_x$ as a saturation corrected image data set output.

20. The computer-readable medium of instructions with computer-readable instructions stored thereon for dynamic color saturation adjustment of claim 19 further comprising:

instructions for generating the values $R_x$ as $P_x^G$, wherein G is a selected gamma correction factor corresponding to an associated display; and instructions for generating values $P'_x$ as $R'_x{}^{1/G}$.

21. The computer-readable medium of instructions with computer-readable instructions stored thereon for dynamic color saturation adjustment of claim 20 further comprising:

instructions for converting density space $R_x$ values so as to be represented by corresponding values $D_x$ in a density space;

instructions for a masking operation to values $D'_x$ so as to form corresponding saturation corrected density values $D'_x$; and instructions for converting the saturation corrected density values $D'_x$ from the density space to the density space as to generate the saturation corrected values $R'_x$.

22. The computer-readable medium of instructions with computer-readable instructions stored thereon for dynamic color saturation adjustment of claim 21 further comprising:

instructions for generating the $D_x$ values as $-\text{Log}_{10}R_x$; and instructions for generating the $R'_x$ as $10^{-D'x}$.

23. The computer-readable medium of instructions with computer-readable instructions stored thereon for dynamic color saturation adjustment of claim 22, wherein the color space C is RGB, such that $C_1$=Red, $C_2$=Green, and $C_3$=Blue, wherein each value $C_n$ is has a binary value in the range of 0 to $2^M$, wherein $M \geq 8$.

24. The computer-readable medium of instructions with computer-readable instructions stored thereon for dynamic color saturation adjustment of claim 20 further comprising:

instructions for calculating for each pixel $P_x$ a corresponding saturation adjustment value specific thereto as a function of $C_1, C_2, \ldots, C_n$; and instructions for applying the corresponding saturation adjustment value to each pixel so as to generate each corresponding $R'_x$.

25. A computer-implemented method for dynamic color saturation adjustment comprising the steps of:

receiving an image data set formed from pixel values P encoded in an n-dimensional color space C, wherein n is an integer greater than one, such that each pixel $P_x$ of the image data is represented by a value $P_x=(C_1, C_2, \ldots, C_n)$ wherein each received image pixels $P_x$ is in a selected value range;

converting received image data $P_x$ to input reflectance space data comprised of corresponding values in reflectance space;

logarithmically converting input reflectance space data so as to be represented by corresponding values $R_x$ in a density space;

generating saturation corrected values $R'_x$ by application of a masking equation corresponding to each value $R_x$;

performing an antilog conversion of the saturation corrected values $R'_x$ from the density space to output reflectance space data comprised of corresponding values thereto;

converting output reflectance space data to the n-dimensional color space C as corresponding saturation corrected pixel values $P'_x$; and outputting the saturation corrected pixel values $P'_x$, as a saturation corrected image data set output.

26. The computer-implemented method for dynamic color saturation adjustment of claim 25 further comprising the steps of:

generating the values $R_x$ as $P_x^G$, wherein G is a selected gamma correction factor corresponding to an associated display; and generating values $P'_x$, as $R'_x{}^{1/G}$.

27. The computer-implemented method for dynamic color saturation adjustment of claim 26 further comprising the steps of:

converting density space $R_x$ values so as to be represented by corresponding values $D_x$ in a density space;

a masking operation to values $D_x$ so as to form corresponding saturation corrected density values $D'_x$; and converting the saturation corrected density values $D'_x$ from the density space to the density space as to generate the saturation corrected values $R'_x$.

28. The computer-implemented method for dynamic color saturation adjustment of claim 27 further comprising the steps of:

generating the $D_x$ values as $-\text{Log}_{10}R_x$; and generating the $R'_x$ as $10^{-D'x}$.

29. The computer-implemented method for dynamic color saturation adjustment of claim 28, wherein the color space C is RGB, such that $C_1$=Red, $C_2$=Green, and $C_3$=Blue, wherein each value $C_n$ is has a binary value in the range of 0 to $2^M$, wherein $M \geq 8$.

30. The computer-implemented method for dynamic color saturation adjustment of claim 26 further comprising the steps of:

calculating for each pixel $P_x$ a corresponding saturation adjustment value specific thereto as a function of $C_1, C_2, \ldots, C_n$; and applying the corresponding saturation adjustment value to each pixel so as to generate each corresponding $R'_x$.

* * * * *